US010754921B2

(12) United States Patent
Khaddam-Aljameh et al.

(10) Patent No.: US 10,754,921 B2
(45) Date of Patent: Aug. 25, 2020

(54) RESISTIVE MEMORY DEVICE WITH SCALABLE RESISTANCE TO STORE WEIGHTS

(71) Applicant: International Business Machines Corporation, Armonk, NY (US)

(72) Inventors: Riduan Khaddam-Aljameh, Zurich (CH); Abu Sebastian, Adliswil (CH); Manuel Le Gallo-Bourdeau, Zurich (CH); Milos Stanisavljevic, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/249,471

(22) Filed: Jan. 16, 2019

(65) Prior Publication Data

US 2020/0226200 A1 Jul. 16, 2020

(51) Int. Cl.
*G06F 17/16* (2006.01)
*G11C 13/00* (2006.01)

(52) U.S. Cl.
CPC .......... *G06F 17/16* (2013.01); *G11C 13/0004* (2013.01); *G11C 13/004* (2013.01); *G11C 13/0064* (2013.01); *G11C 13/0069* (2013.01); *G11C 2013/005* (2013.01); *G11C 2213/15* (2013.01)

(58) Field of Classification Search
CPC ... G06F 17/16; G11C 13/0069; G11C 13/004; G11C 13/0004; G11C 13/0064; G11C 2213/15; G11C 2013/005
See application file for complete search history.

(56) References Cited

U.S. PATENT DOCUMENTS

| 2015/0106316 A1* | 4/2015 | Birdwell | G06F 16/22 |
| | | | 706/33 |
| 2015/0371705 A1* | 12/2015 | Onkaraiah | G11C 13/0007 |
| | | | 327/208 |
| 2017/0017879 A1* | 1/2017 | Kataeva | G06N 3/084 |
| 2017/0109626 A1* | 4/2017 | Gokmen | G06N 3/0472 |
| 2018/0068722 A1 | 3/2018 | Friedman et al. | |

FOREIGN PATENT DOCUMENTS

| WO | 2017131632 A1 | 8/2017 |
| WO | 2017146706 A1 | 8/2017 |

OTHER PUBLICATIONS

Nandakumar, S. R. et al., "Mixed-Precision Training of Deep Neural Networks using Computational Memory", arXiv:1712.01192v1, Dec. 4, 2017, 9 pages.

Burr, G.W., et al., "Neuromorphic computing using non-volatile memory", Advances in Physics: X, 2017, Received Aug. 31, 2016, Accepted Nov. 1, 216, pp. 89-124, vol. 2, No. 1.

(Continued)

*Primary Examiner* — Ajay Ojha
(74) *Attorney, Agent, or Firm* — Scully, Scott, Murphy & Presser, P.C.; Daniel P. Morris (57) ABSTRACT

A memory device may include a plurality of resistive elements and a control unit for controlling the memory device. The memory device is configured to program single weights of the memory device by groups of at least two resistive elements. A related method and a related computer program product may be also provided.

17 Claims, 6 Drawing Sheets

(56) References Cited

OTHER PUBLICATIONS

Tuma, T., et al., "Stochastic phase-change neurons", Nature Nanotechnology, Published online May 16, 2016, Aug. 2016, pp. 693-700, vol. 11.
Le Gallo, M., et al., "Inherent stochasticity in phase-change memory devices", ESSDERC 2016—46th European Solid-State Device Research Conference, Sep. 2016, pp. 373-376.
Close, G.F., et al., "Device, circuit and system-level analysis of noise in multi-bit phase-change memory", 2010 IEEE International Electron Devices Meeting (IEDM), Dec. 6-8, 2010, pp. 29.5.1-29.5.4.
Papandreou, N., et al., "Programming Algorithms for Multilevel Phase-Change Memory", 2011 IEEE International Symposium on Circuits and Systems (ISCAS), Jun. 2011, pp. 329-332.
Zipoli, F., et al., "Structural origin of resistance drift in amorphous GeTe", Physical Review B 93, Mar. 2016, pp. 115201-1-115201-12.
Sebastian, A., et al., "A Collective Relaxation Model for Resistance Drift in Phase Change Memory Cells", 2015 IEEE International Reliability Physics Symposium, Apr. 19-23, 2015, MY.5.1-MY.5.6.

\* cited by examiner

FIG. 1

$$G_{ij} = \alpha_1 G_{ij_1} + \alpha_2 G_{ij_2} + \ldots + \alpha_N G_{ij_N}$$

RESISTIVE MEMORY DEVICE WITH SCALABLE RESISTANCE TO STORE WEIGHTS

BACKGROUND

The present disclosure is related to a memory device comprising a plurality of resistive elements.

The present disclosure further concerns a related method and a related computer program product.

Nanoscale memory devices, whose resistance depends on the history of the electric signals applied, could become building blocks in new computing paradigms, such as brain-inspired computing and memcomputing.

One promising example for resistive memory devices is phase-change memory (PCM) devices. PCM is a non-volatile solid-state memory technology that exploits the reversible, thermally-assisted switching of phase-change materials, in particular chalcogenide compounds such as GST (Germanium-Antimony-Tellurium), between states with different electrical resistance. The fundamental storage unit (the "cell") can be programmed into a number of different states, or levels, which exhibit different resistance characteristics. The programmable cell-states can be used to represent different data values, permitting storage of information.

Reading and writing of data in PCM cells is achieved by applying appropriate voltages to the phase-change material via a pair of electrodes associated with each cell. In a write operation, the resulting programming signal causes Joule heating of the phase-change material to an appropriate temperature to induce the desired cell-state on cooling. Reading of PCM cells is performed using cell resistance as a metric for cell-state. An applied read voltage causes current to flow through the cell, this current being dependent on resistance of the cell. Measurement of the cell current therefore provides an indication of the programmed cell state. A sufficiently low read voltage is used for this resistance metric to ensure that application of the read voltage does not disturb the programmed cell state. Cell state detection can then be performed by comparing the resistance metric with predefined reference levels for the programmable cell-states.

Cognitive computing is a promising technology for deriving intelligence and knowledge from huge volumes of data. Today's cognitive computers are usually based on the Von Neumann architecture in which the computing and the memory units are separated. Cognitive computing is inherently data-centric, meaning that huge amounts of data need to be shuttled back and forth at high speeds. As the Von Neumann architecture is rather inefficient for such a task, it is becoming increasingly clear that other architectures are desired to build efficient cognitive computers, in particular architectures where memory and logic coexist in some form.

Memcomputing is a non-Von Neumann approach being researched. An element in this computing paradigm is a high-density, low-power, variable state, programmable and non-volatile memory device.

A fundamental computational primitive is a matrix-vector multiplication. This primitive is of particular interest as it forms the basis of several linear algebraic operations and it is one of the most commonly used mathematical operations in science and engineering. A matrix is usually represented by a two-dimensional array of matrix elements and a vector by a one-dimensional array of vector elements. A matrix may be considered as array of vectors. Hence a matrix-vector multiplication can be generalized to a matrix-matrix multiplication and to a vector-vector multiplication.

However, there are key challenges to overcome, such as the high programming power required, noise and resistance drift.

Accordingly there is a need for further improvements of memory devices comprising resistive elements.

SUMMARY

According to a first aspect, the invention is embodied as a memory device comprising a plurality of resistive elements and a control unit for controlling the memory device. The memory device is configured to program single weights of the memory device by groups of at least two resistive elements.

According to another aspect, a method for operating a memory device comprising a plurality of resistive elements and a control unit for controlling the memory device is provided. The method comprises programming single weights of the memory device by groups of at least two resistive elements.

According to another aspect a computer program product for operating a memory device comprising a plurality of resistive elements and a control unit for controlling the memory device is provided. The computer program product comprises a computer readable storage medium having program instructions embodied therewith. The program instructions are executable by the control unit of the memory device to cause the control unit to perform a method comprising programming single weights of the memory device by groups of at least two resistive elements.

Embodiments of the invention will be described in more detail below, by way of illustrative and non-limiting examples, with reference to the accompanying drawings.

DETAILED DESCRIPTION

In reference to FIGS. 1-11, some general aspects and terms of embodiments of the invention are described.

According to embodiments of the invention, a resistive element may be defined as an element which comprises a resistive material and whose electrical resistance can be changed by applying an electrical programming signal to the resistive element. The resistive element may be in particular embodied as resistive memory element. The electrical programming signal may be, e.g., a current flowing through the resistive memory element, or an electrical voltage applied to the resistive memory element. The current and/or voltage may be, e.g., applied to the resistive memory element in the form of pulses. As a result, the electrical resistance of a resistive memory element depends on the history of current that had previously flown through the memory element and/or the history of the electric signal that had been applied to the resistive memory element.

Resistive memory elements are based on a physical phenomenon occurring in a material that changes its resistance under action of a current or electric field. The change is usually non-volatile and reversible. Several classes of resistive memory elements are known, ranging from metal oxides to chalcogenides. Typical resistive memory elements are metal/insulator/metal structures where the metallic components serve as the electrodes and the insulator is a resistive switching material, e.g., a chalcogenide. These resistive memory elements exhibit good performance in terms of power consumption, integration density potential, retention, and endurance.

Embodiments of the invention are in particular suitable to provide a way to do inexact fast matrix multiplication with high accuracy. The result from this multiplication may be used in algorithms that do not require high precision for multiplication tasks.

Embodiments of the invention may bring significant power and/or speed advantages compared to the conventional Von-Neumann approach where the data has to be shuttled back and forth between a central processing unit (CPU) and the memory.

As a matrix-vector multiplication can be generalized to a matrix-matrix multiplication and to a vector-vector multiplication, the device and the methods according to embodiments of the invention can also be used to perform matrix-matrix multiplications and vector-vector multiplications.

Figure 1:
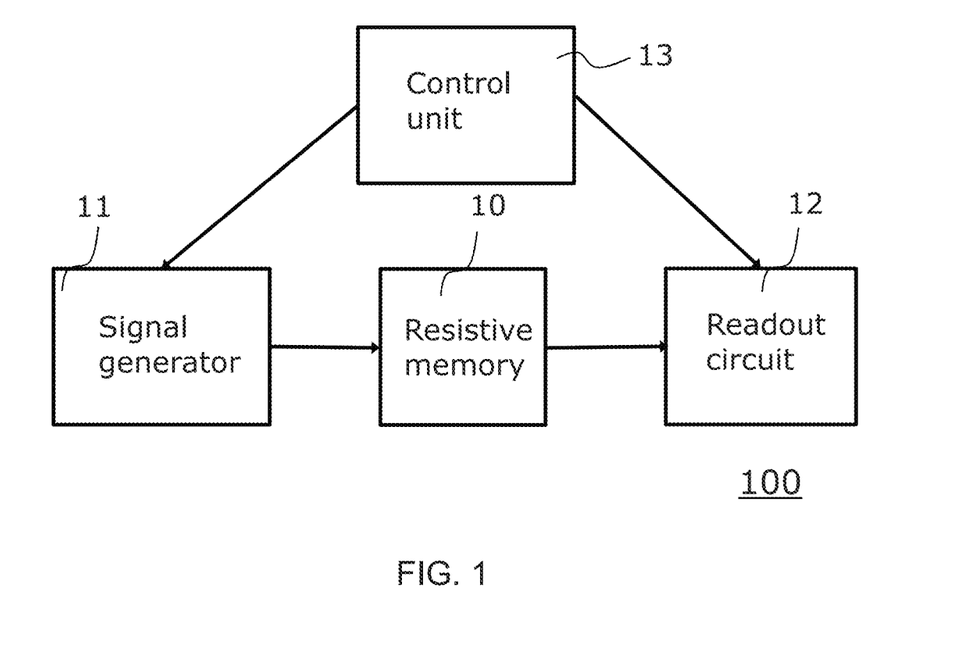
FIG. 1 is a simplified schematic block diagram of a memory device according to an embodiment of the invention.

FIG. 1 is a simplified schematic block diagram of a memory device 100. The memory device 100 comprises a resistive memory 10 having a plurality of resistive memory elements. Furthermore, a signal generator 11 is provided. The signal generator 11 is configured to apply electrical programming signals to the resistive memory elements of the resistive memory 10. The signal generator 11 comprises circuitry for programming the resistive memory cells during data write or programming operations. According to some embodiments, the memory device 100 may be a classical memory device configured to store information. According to other embodiments, the memory device 100 may be a memcomputing device configured to perform computations. In particular, the memory device 100 may be a device for performing a matrix-vector multiplication of a matrix with a vector. According to such an embodiment, the signal generator 11 is configured to receive a matrix A as input and to apply programming signals to the memory elements to program conductance values of the resistive memory elements for a matrix-vector multiplication. The conductance values represent matrix values of the matrix that shall be multiplied with the vector.

In addition, the memory device 100 comprises a readout circuit 12 configured to read out resistance values of the resistive memory elements during data read operations. In the embodiment of a memcomputing device, the readout circuit 12 may be configured to apply read out voltages to the rows of a memory crossbar array. The read out voltages represent vector elements of the vector that shall be multiplied with the matrix. The device is further configured to read out current values of columns of the memory array. The current values represent result values of vector elements of a result vector of the multiplication.

The device 100 further comprises a control unit 13 configured to control the signal generator 11 and the readout circuit 12.

The memory 10 may be generally any kind of resistive memory as described above. According to embodiments it may be a phase change memory (PCM) comprising phase-change memory elements, a conductive bridge random access memory (CBRAM), a metal-oxide resistive random access memory (RRAM), a magneto-resistive random access memory (MRAM), a ferroelectric random access memory (FeRAM) or an optical memory. According to another embodiment it may be a system memory comprising system elements. The system elements may comprise e.g. a plurality of transistors, resistors, capacitors, and/or inductors which are configured to jointly emulate a behavior of a resistive element.

In the following it is assumed that the resistive memory 10 is embodied as PCM. Accordingly the resistive memory 10 comprises a plurality of PCM cells as resistive memory elements. The PCM cells of memory 10 may comprise a plurality of programmable resistance states. The plurality of programmable resistance-states corresponds to different relative proportions of the amorphous and crystalline phases within the PCM material of the cell. These states may include a high-resistance, fully-amorphous RESET state, a low-resistance, fully-crystalline SET state, and a number of intermediate states corresponding to increasing size of the crystalline phase within the otherwise amorphous PCM material. The programmable cell-states are typically defined in terms of predetermined reference values, or ranges of values, of the resistance metric used for read detection by the readout circuit 12.

Figure 2:
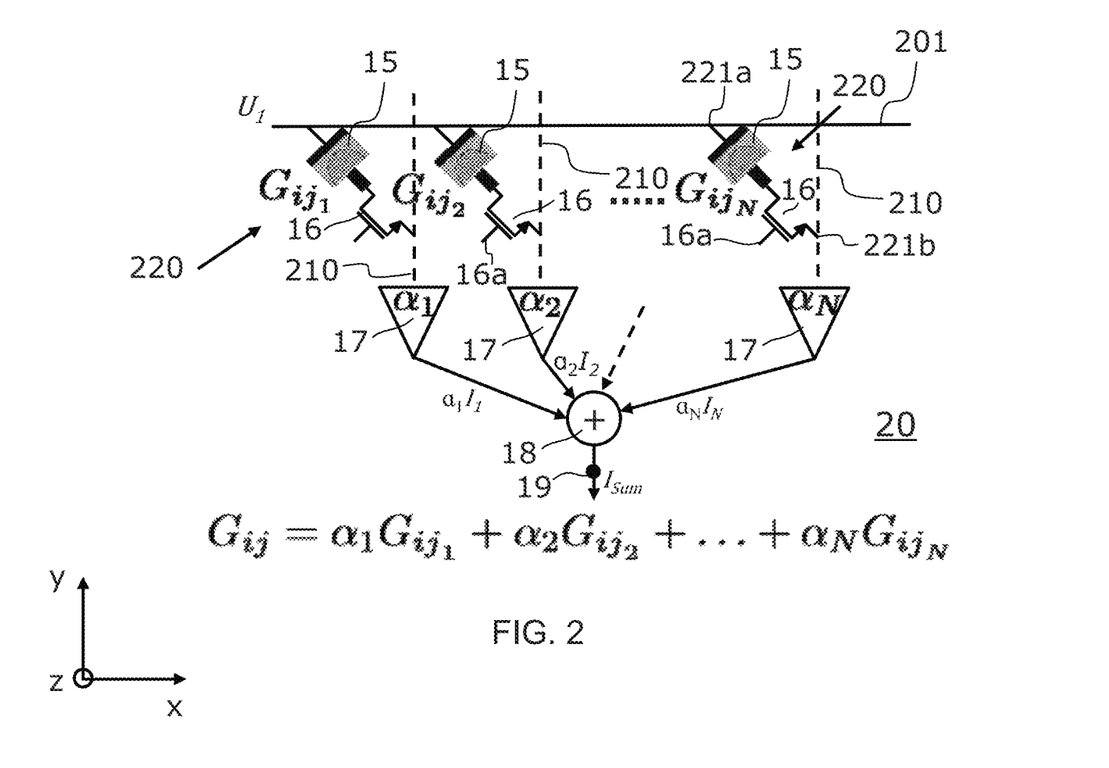
FIG. 2 shows an exemplary group of resistive elements of a resistive memory representing a single weight.

FIG. 2 shows an exemplary group 20 of resistive elements 15 of the resistive memory 10. More particularly, the group 20 comprises a plurality of N resistive elements 15, wherein N is a positive integer $\geq 2$. The group 20 of the N resistive elements 15 represents a single weight of the memory device 100. In other words, the memory device 100 programs single weights by means of the group 20 of the resistive elements 15. A single weight of the memory device 100 shall be understood as the programmed analog memory value of the group 20.

The memory device 100 and more particularly the resistive memory 10 comprises a plurality of the groups 20. More particularly, for each single weight or in other words for each memory value to be stored a separate group 20 is provided by the memory device 100.

The memory device 100 is configured to program the single weights as a linear combination $G_{ij}$ of N individual conductance values $G_{ijk}$ and/or resistance values $R_{ijk}$ of the resistive elements 15 of the groups 20, wherein k=1, 2, ... N.

The linear combination comprises a plurality of scale factors $\alpha_k$ for scaling the individual conductance values $G_{ijk}$ and/or resistance values $R_{ijk}$ of the resistive elements 15 of the groups 20.

This may be expressed by the following formula:

$$G_{ij} = \alpha_1 G_{ij_1} + \alpha_2 G_{ij_2} + \ldots + \alpha_N G_{ij_N}$$

The group 20 comprises a row line 201 and a plurality of N column lines 210. The row line 201 is arranged above the column lines 210, which is indicated by dotted lines. More particularly, the row lines 201 extends in a first x-y-plane and the column lines 210 extend in a second x-y plane, wherein the first x-y plane is arranged in the vertical z-direction above the second x-y-plane.

The row line 201 is electrically connected to the column lines 210 via vertical junctions 220. The vertical junctions 220 extend in the vertical z-direction between upper cross points 221a of the row lines 201 and lower cross points 221b of the column lines 210.

Each junction 220 comprises a serial arrangement of a resistive memory element 15 and a transistor 16. The transistors 16 serve as access elements and comprise a gate 16a as access terminal for controlling/accessing the respective memory element 15. The column lines 210 are electrically connected to scaling units 17. The scaling units 17 provide scale factors $\alpha_1, \alpha_2, \ldots \alpha_N$ for scaling the individual conductance values $G_{ijk}$ and/or resistance values $R_{ijk}$ of the resistive elements 15 of the group 20.

After programming the resistive elements 15 of the group 20, a read operation may be performed as follows.

The readout circuit 12 applies a read voltage $U_1$ to the row line 201. Furthermore, the readout circuit 12 reads out current values of the column lines 210 which are scaled with corresponding scaling factors by the scaling units 17. More particularly, the readout circuit 12 reads out current values $\alpha_1 I_1, \alpha_2 I_2, \ldots, \alpha_N I_N$ from the column lines 210. The current values $\alpha_1 I_1, \alpha_2 I_2, \ldots \alpha_N I_N$ are summed up to a summation current $I_{Sum} = \alpha_1 I_1 + \alpha_2 I_2, \ldots \alpha_N I_N$ by a summation unit 18 and provided as output signal at a node 19.

As a result, the single weight $G_{ij}$ of the group 20 may be derived as the quotient $I_{Sum}/U_1$.

According to some embodiments, the memory device 100 may assign the same scale factor to all the resistive elements of the groups. Hence according to such an embodiment all resistive elements 15 are chosen to have equal significance ($\alpha_1 = \alpha_2 \ldots, = \alpha_N = 1$). According to other embodiments, the memory device 100 is configured to assign at least two different scale factors to the resistive elements of the groups. According to embodiments, the memory device 100 programs the individual conductance and/or resistance values and the corresponding scale factors in such a way that drift and/or noise are minimized.

According to embodiments the device may assign different individual conductance values to the resistive elements 15 of the groups 20. Furthermore, it may assign to a higher individual conductance value a higher scale factor $\alpha_i$ than to a lower individual conductance value. This may be in particular useful for devices comprising resistive elements where high conductance states exhibit less drift and noise than low conductance states, as e.g. in phase change memory devices.

Figure 3:
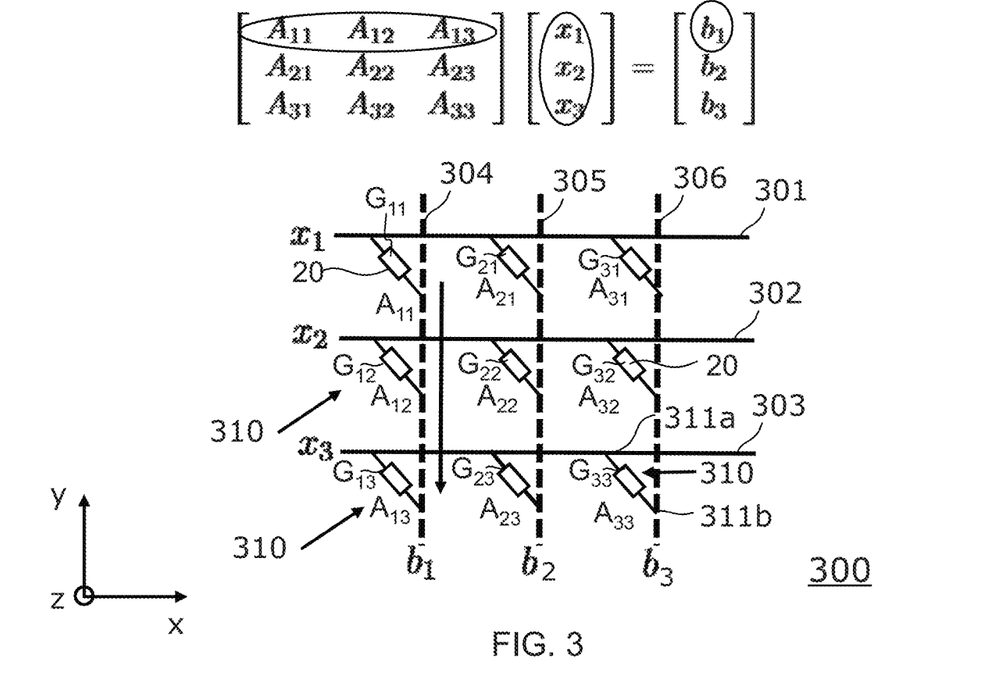
FIG. 3 illustrates an example of memory device for performing a matrix vector multiplication according to an embodiment of the invention.

FIG. 3 illustrates an example of a matrix multiplication according to an embodiment of the invention. The matrix multiplication uses Ohm's law and Kirchhoff's law in a resistive memory crossbar array 300.

According to the illustrated example, a matrix A of size 3×3 shall be multiplied with a vector x and the result is a product or result vector b:

$$\begin{bmatrix} A_{11} & A_{12} & A_{13} \\ A_{21} & A_{22} & A_{23} \\ A_{31} & A_{32} & A_{33} \end{bmatrix} \begin{bmatrix} x_1 \\ x_2 \\ x_3 \end{bmatrix} = \begin{bmatrix} b_1 \\ b_2 \\ b_3 \end{bmatrix}$$

Accordingly, the matrix A comprises a first column consisting of the matrix elements $A_{11}, A_{21}$ and $A_{31}$, a second column consisting of the matrix elements $A_{12}, A_{22}$ and $A_{32}$ and a third column consisting of the matrix elements $A_{13}, A_{23}$ and $A_{33}$ The vector x comprises the vector elements $x_1, x_2$ and $x_3$.

For such a multiplication of the matrix A with the size 3×3, the resistive memory 10 comprises a memory crossbar array 300 of a corresponding size 3×3.

The memory crossbar array 300 comprises 3 row lines 301, 302 and 303 and three column lines 304, 305 and 306. The three row lines 301, 302 and 303 are arranged above the three column lines 304, 305 and 306 which is indicated by dotted lines. More particularly, the row lines 301, 302 and 303 extend in a first x-y-plane and the three column lines extend in a second x-y plane, wherein the first x-y plane is arranged in the vertical z-direction above the second x-y-plane.

The three row lines 301, 302 and 303 and the three column lines 304, 305 and 306 are connected to each other via vertical junctions 310. The junctions 310 extend in the vertical z-direction between upper cross points 311a of the row lines 301-303 and lower cross points 311b of the column lines 304-306.

Each junction 310 comprises a group 20 of resistive elements 15 as shown in FIG. 2. For ease of illustration, the groups 20 are just illustrated as single weights/conductance values $G_{ij}$. The lower cross points 311b of junctions 310 correspond to the output node 19 of the groups 20 as shown in FIG. 2. In other words, the output node 19 of the respective group 20 is electrically connected to one of the respective column lines 304, 305 or 306 at the respective lower cross point 311b.

More particularly, the crossbar array 300 comprises 9 groups 20 of resistive memory elements 15, wherein each of them is embodied as illustrated in FIG. 2 and represents a single weight $G_{ij}$ or in other words an individual conductance value $G_{ij}$ The column line 304 comprises single weights $G_{11}, G_{12}$ and $G_{13}$, the column line 305 comprises single weights $G_{21}, G_{22}$ and $G_{23}$ and the column line 306 single weights $G_{31}, G_{32}$ and $G_{33}$.

In order to perform the matrix vector multiplication of the above matrix, the signal generator 11 applies programming signals, in particular current pulses, to the groups of resistive memory elements and thereby programs the conductance values for the matrix-vector multiplication.

More particularly, the conductance values of the groups of resistive memory elements represent matrix values of the matrix of the matrix-vector multiplication. Accordingly, the conductance $G_{11}$ is programmed to the matrix value $A_{11}$, the conductance $G_{12}$ is programmed to the matrix value $A_{12}$, or more generally the conductance Gij is programmed to a corresponding matrix value Aij.

Then the readout circuit 12 applies read voltages to the row lines 301, 302 and 303. More particularly, the readout circuit 12 applies a read voltage $X_1$ to the row line 301, a read voltage $X_2$ to the row line 302 and a read voltage $X_3$ to the row line 303. Hence the read voltages represent vector values of the vector of the matrix-vector multiplication.

Furthermore, the readout circuit 12 reads out current values of the column lines 304, 305 and 306. As an example, the readout circuit 12 reads out a current value $b_1$ from the column line 304, which is the sum of three multiplications, namely $b_1 = A_{11}x_1 + A_{12}x_2 + A_{13}x_3$.

Accordingly, the readout circuit 12 reads out a current value $b_2$ from the column line 305 and a current value $b_3$ from the column line 306. The current values represent the result values of the vector elements of the product vector b.

Figure 4:
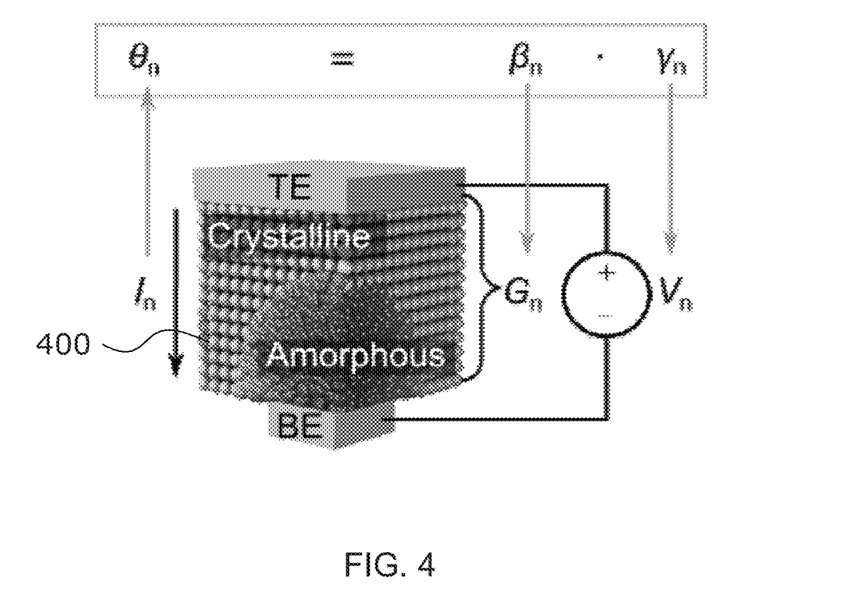
FIG. 4 illustrates an exemplary embodiment of a scalar multiplication that may be performed by a PCM cell.

FIG. 4 illustrates an exemplary embodiment of a scalar multiplication that may be performed by a PCM cell 400. Such a scalar multiplication forms the basis of the matrix-vector multiplication performed according to embodiments of the invention. Let $\theta_n$, where $\beta_n$ and $\gamma_n$ are numbers generated uniformly in [0,1]. $\beta_n$ is mapped to an effective conductance $G_n$, and $\gamma_n$ to a voltage $V_n$. As the current in the PCM cell 300 is a slightly non-linear function of the voltage, the analogue scalar multiplication may be expressed to follow a "pseudo" OHM's law, namely by $$I_n \cong \alpha G_n \cdot f(V_n).$$

In this equation, $\alpha$ is a time dependent conductance variation parameter and f a function, in particular a polynomial function that approximates the current-voltage characteristics of the PCM cell 400. The individual PCM cell 400 may be programmed to the effective conductance $G_n$ by single shot programming or an iterative program and verify procedure. Then the readout circuit 12 may apply a read voltage $V_n$ and readout the current $I_n$. Finally, the current $I_n$ is converted back to approximate the value $\theta_n$, representing the result of the scalar multiplication.

Figure 5:
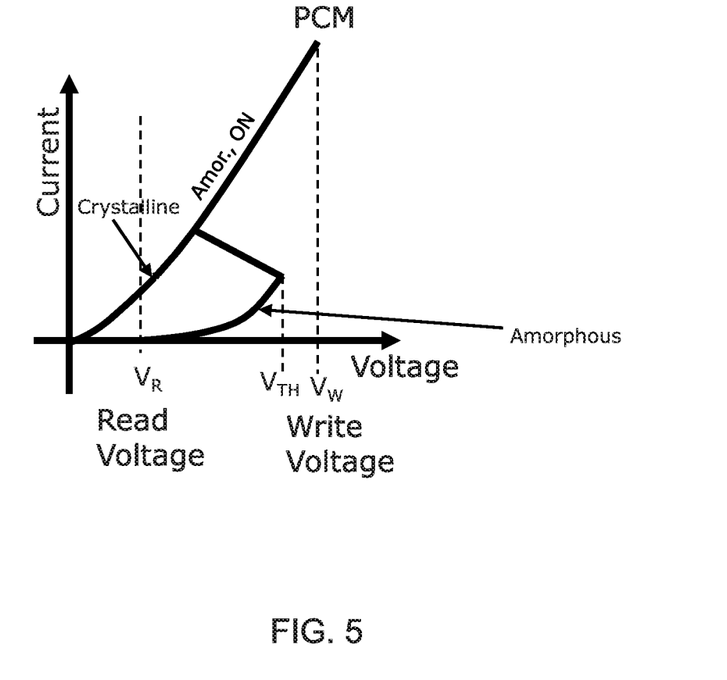
FIG. 5 is a schematic illustration of the current/voltage (and hence resistance) characteristics of the material components of a memory cell.

FIG. 5 is a schematic illustration of the current/voltage (and hence resistance) characteristics of the material components of the memory cell 400 of FIG. 4. The solid lines indicate variation of current with voltage for the PCM material, starting from the fully-crystalline SET state (upper curve) and also the fully-amorphous RESET state (lower curve). These two curves reflect the large (typically 3 orders of magnitude) variation in resistivity between the crystalline and amorphous phases. The amorphous phase exhibits a non-linear characteristic with a threshold switching phenomenon that is field induced. At a certain threshold voltage $V_{TH}$, this phase switches to a very low "ON-state" resistance corresponding to that of the crystalline PCM material. The cell programming (write) voltage is selected to be above this threshold voltage as indicated.

Figure 6:
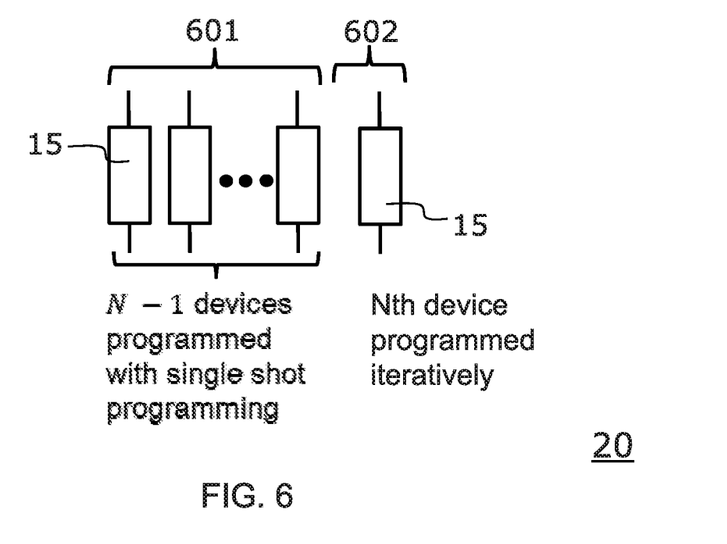
FIG. 6 illustrates a programming scheme according to embodiments of the invention.

FIG. 6 illustrates a programming scheme according to embodiments of the invention. It shows a group 20 of N resistive elements 15, wherein N is a positive integer ≥2. The corresponding memory device is configured such that a first subset 601 of the resistive elements 15 of the groups 20 is programmed by single shot programming, wherein the single shot programming scheme is a non-iterative programming scheme. A second subset 602 of the resistive elements 15 of the groups 20 is programmed by an iterative programming scheme. The iterative programming scheme is configured to correct induced conductance changes by a feedback mechanism. According to this embodiment, the first subset 601 comprises N-1 resistive elements 15, while the second subset 602 comprises only one resistive element.

Figure 7:
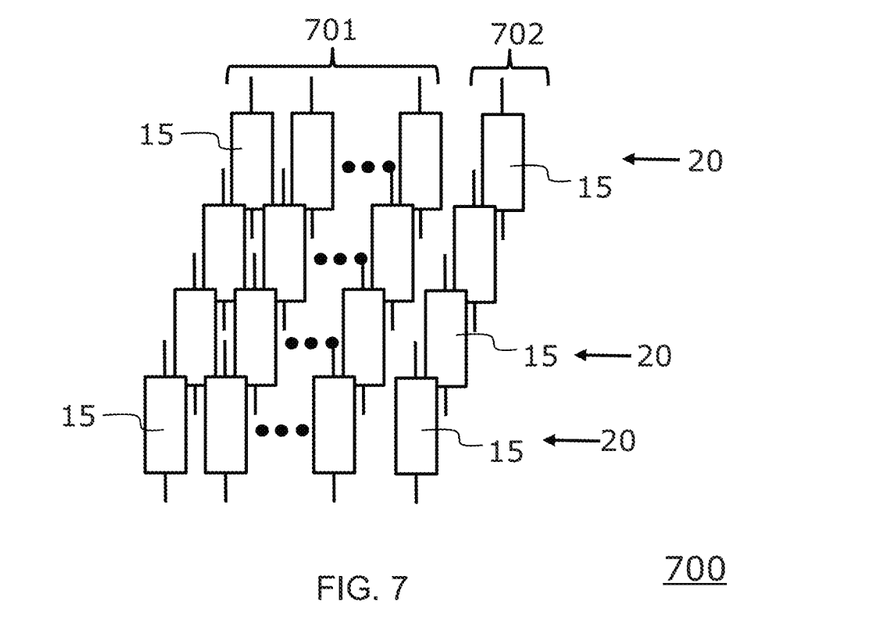
FIG. 7 illustrates another programming scheme according to embodiments of the invention.

FIG. 7 illustrates another programming scheme according to embodiments of the invention. It shows an array 700 comprising a plurality of groups 20 of resistive elements 15. Each group 20 comprises a number of N resistive elements 15. Each group comprises a first subset 701 comprising N-1 resistive elements 15 and a second subset 702 comprising one resistive element 15.

The corresponding memory device is configured to perform, at a first programming step, the single shot programming of the resistive elements 15 of all the first subsets 701 and, at a second programming step, the iterative programming of the resistive elements 15 of all the second subsets 702 of the array. According to embodiments, a waiting step is performed between the first and the second programming step. In other words, after having performed the first programming step, the control unit waits for a specific time period before it continues with the second programming step. During the waiting step, the drift of the conductance values of the resistive elements of the first subsets 701 can stabilize. Then, the weights of the resistive elements of the first subset 701 are read and the second subset 702 of resistive elements are programmed with the iterative programming scheme based on the conductance values read from those drifted weights. This way, it is expected that the final weights will be more precise, because the feedback is performed on the already drifted weights.

Figure 8:
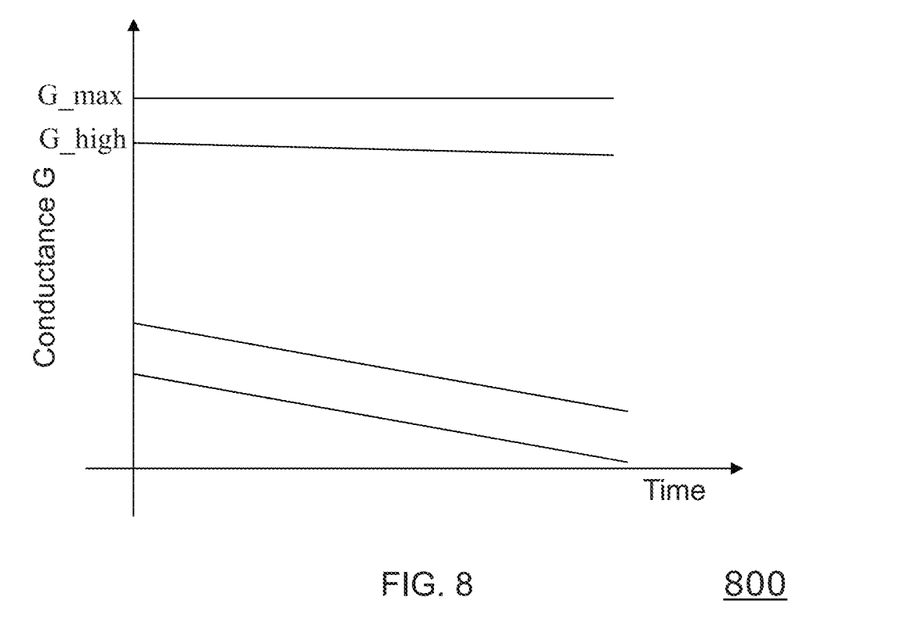
FIG. 8 shows a schematic diagram of the drift behavior of exemplary resistive elements, more particularly of PCM elements.

FIG. 8 shows a schematic diagram of the drift behavior of exemplary resistive elements, more particularly of PCM elements. The x-axis denotes the time t and the y-axis the conductance G. As can be seen in FIG. 8, high conductance states exhibit less drift than low conductance states. G_max denotes the maximum possible conductivity/conductance state that may be reached, while G_high denotes a high individual conductance value to which resistive elements of first subsets may be programmed according to embodiments of the invention, as will be explained in more detail further below.

Figure 9:
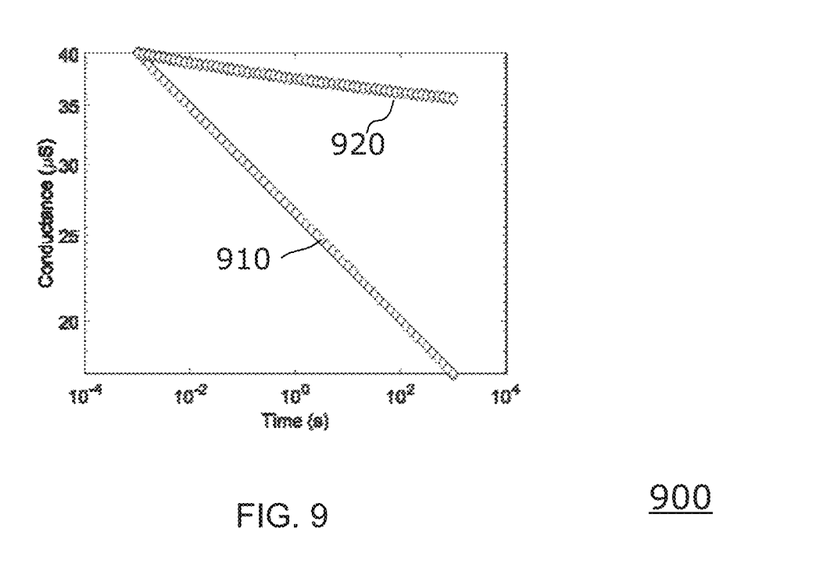
FIG. 9 shows simulation results of the conductance of exemplary memory devices for which single weights have been programmed with different programming schemes.

FIG. 9 shows simulation results of the conductance of exemplary memory devices for which single weights have been programmed with different programming schemes. The resistive elements of the memory devices are assumed to be phase change elements. The x-axis denotes the time t and the y-axis the conductance G. It is assumed that the maximum conductance per resistive element is 10 uS. It is furthermore assumed that the drift coefficient increases with decreasing conductance. More particularly, for the simulation the drift coefficient is assumed to be 0.1 for conductance values close to zero and 0 for the maximum conductance value of 10 uS.

The simulation of curve 910 was performed for a group of 10 resistive elements representing a single weight and wherein all 10 resistive elements have been programmed iteratively to a conductance of 4 uS.

The simulation of curve 920 was performed for a group of 5 resistive elements representing a single weight and wherein 4 resistive elements of a first subset have been programmed to 9.1 uS, 9.4 uS, 9.2 uS and 9.3 uS respectively using single shot programming and one resistive element of a second subset has been programmed iteratively to 3 uS.

As can be derived from FIG. 9, the second approach shows significantly lower drift than the first approach due to the use of high conductance values for the first subset of resistive elements.

Figure 10:
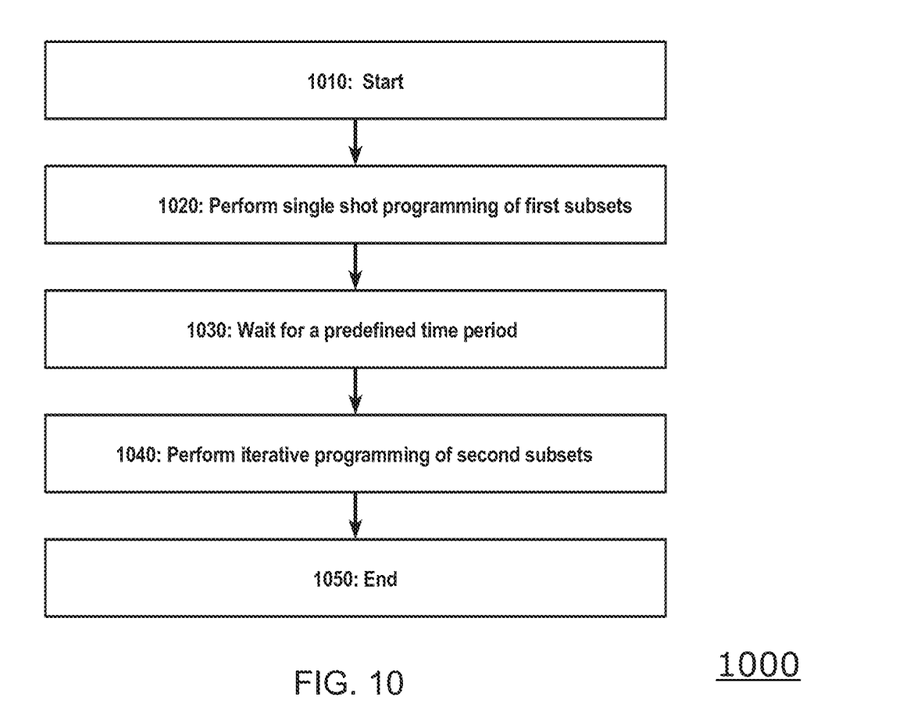
FIG. 10 shows a flow chart of methods step of a method for operating a memory device according to an embodiment of the invention.

FIG. 10 shows a flow chart of methods step of a method for operating a memory device according to an embodiment of the invention, e.g. of the memory device 100 of FIG. 1. The method steps may be e.g. performed by a computer program that runs in the control unit 13 of the memory device 100.

At a step 1010, the method starts.

At a step 1020, the control unit 13 programs a first subset of the resistive elements of the groups by single shot programming.

At a step 1030, the control unit 13 performs a waiting step and waits for a predefined time period to allow the drift of the conductance values of the resistive elements of the first subset to stabilize.

Then, at a step 1040, the control unit 13 programs a second subset of the resistive elements of the groups by an iterative programming scheme.

At a step 1050, the method ends.

Figure 11:
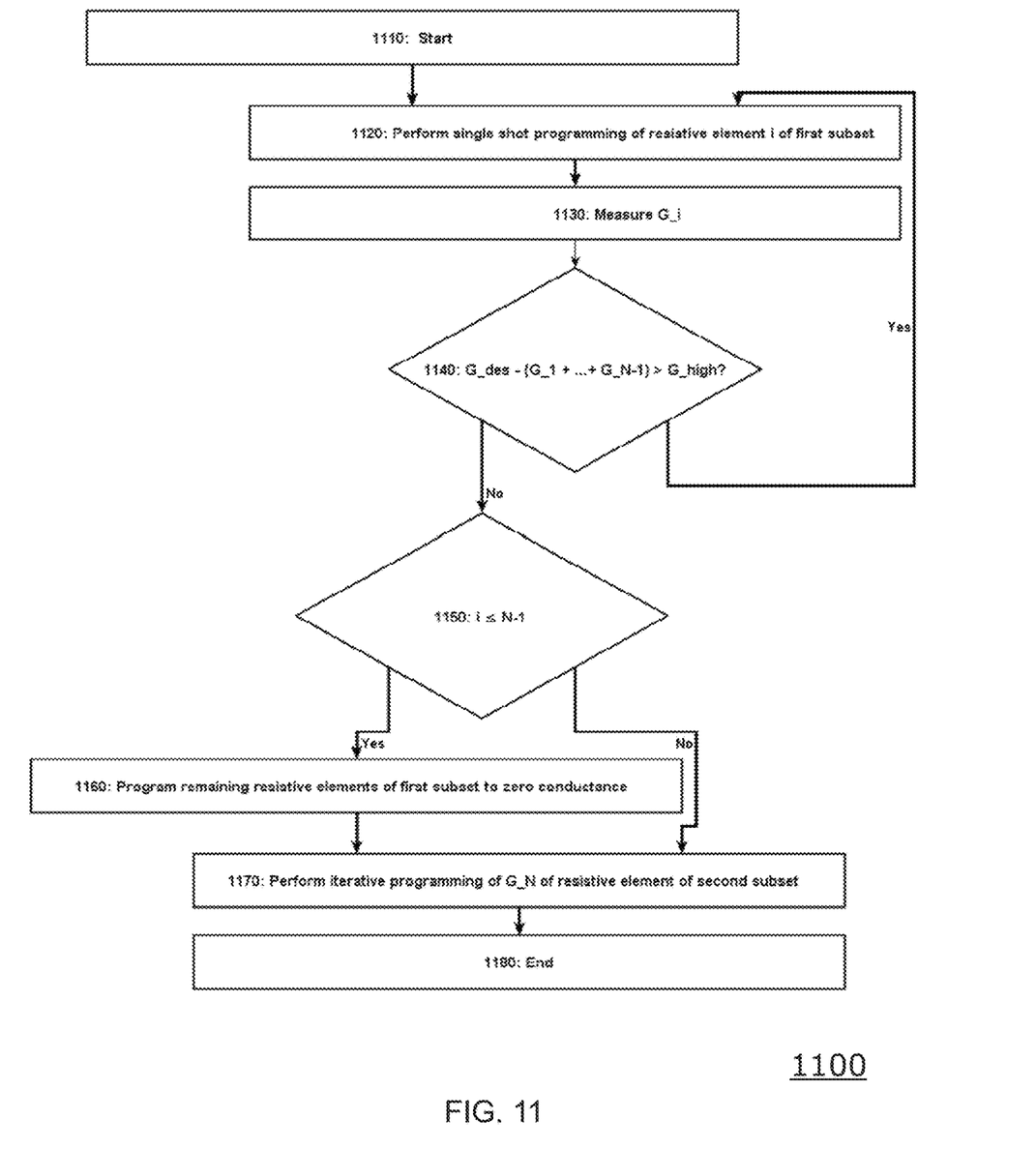
FIG. 11 shows a more detailed flow chart of methods step of a method for operating a memory device according to another embodiment of the invention.

FIG. 11 shows a more detailed flow chart of methods step of a method for operating a memory device according to another embodiment of the invention, e.g. of the memory device 100 of FIG. 1. The method steps may be e.g. performed by a computer program that runs in the control unit 13 of the memory device 100. It is assumed that a group comprises N resistive elements, wherein a first subset comprises N−1 resistive elements and a second subset comprises one resistive element. As explained above, it is advantageous to program resistive elements to a high conductance value, say G_high, wherein G_high is chosen close to G_max (see FIG. 8). All devices are chosen to have equal significance ($\alpha\_1 = \alpha\_2 = \ldots = \alpha\_N = 1$)

At a step 1110, the method starts.

At a first programming step 1120, the control unit 13 performs a single shot programming of the first resistive element of the first subset of the group. More particularly, if G_des is the desired overall conductance value corresponding to the magnitude of the element, and if G_des>G_high, then the first resistive element is programmed to a target value G_ltar approximately equal to G_high using single shot programming. According to this example it is assumed that the first resistive element of the first subset is programmed to a high individual conductance value G_ltar of at least 80% of the maximum conductance value G_max.

At a step 1130, the memory device measures the programmed conductivity G_1 of the first resistive element. Then, at a step 1140, the memory device checks whether (G_des−G_1)>G_high.

If this is the case, the second resistive element is programmed at a step 1120 to a target value G_2tar again approximately equal to G_high using single shot programming The steps 1120 to 1140 are continued in an iterative manner until the (N−1)th resistive device, wherein generally speaking at step 1140 it is checked whether (G_des−(G_1+G_2+ . . . +G_(N−1)))>G_high.

If at a step 1140, (G_des−(G_1+G_2+ . . . +G_(N−1))) <G_high, then it is checked at a step 1150 whether there are still remaining resistive elements of the first subset that have not been programmed. If this is the case, then the remaining resistive elements of the first subset are programmed at a step 1160 to zero.

Finally, at a second programming step 1170, the Nth resistive element is programmed to G_des−(G_1+G_2+ . . . +G_(N−1)) using an iterative programming scheme. The second programming step 1170 corrects the residual programming error G_des−(G_1+G_2+ . . . +G_(N−1)) of the first programming steps 1120 by a feedback mechanism.

At a step 1180, the method stops.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. In general, modifications described for one embodiment may be applied to another embodiment as appropriate.

What is claimed is:

1. A memory device comprising:
   a plurality of resistive elements; and
   a control unit for controlling the memory device;
   wherein the device is configured to program single weights of the memory device by groups of at least two resistive elements, wherein the device is configured to
   program a first subset of the resistive elements of the groups by single shot programming; and
   program a second subset of the resistive elements of the groups by an iterative programming scheme.

2. A memory device according to claim 1, wherein the device is configured to program the single weights as a linear combination of individual conductance and/or resistance values of the at least two resistive elements of the groups, the linear combination comprising a plurality of scale factors for scaling the conductance and/or resistance values of the at least two resistive elements of the groups.

3. A memory device according to claim 1, wherein
   the groups comprise a number of N resistive elements, wherein N is a positive integer $\geq 2$;
   the first subset comprises N−1 resistive elements; and
   the second subset comprises one resistive element.

4. A memory device according to claim 1, wherein the device is configured to
   perform, at a first programming step, the single shot programming of the resistive elements of all first subsets of an array of groups of resistive elements; and
   perform, at a second programming step, the iterative programming of the resistive elements of all the second subsets of the array, wherein the second programming step is configured to correct a residual programming error of the single weights of the first programming step by a feedback mechanism.

5. A memory device according to claim 4, wherein the device is configured to perform a waiting step between the first and the second programming step, the waiting step being adapted to facilitate a stabilization of the drift of the conductance values of the resistive elements of the first subsets.

6. A memory device according to claim 1, wherein the device is configured to assign the same scale factor to all the resistive elements of the groups.

7. A memory device according to claim 1, wherein the device is configured to assign at least two different scale factors to the resistive elements of the groups.

8. A memory device according to claim 1, wherein the device is configured to program the individual conductance and/or resistance values and the corresponding scale factors in such a way that drift and/or noise are minimized.

9. A memory device according to claim 1, wherein the device is configured to
   program a first resistive element of the first subsets to a high individual conductance value of at least 80% of a maximum conductance value, if a desired conductance value of the corresponding single weight is higher than the high individual conductance value.

10. A memory device according to claim 1, wherein the device is configured to
    assign different individual conductance values to the resistive elements of the groups; and assign to a higher individual conductance value a higher scale factor than to a lower individual conductance value.

11. A memory device according to claim 1, wherein the resistive elements are selected from the group consisting of: phase-change memory elements, conductive bridge random access memory elements (CBRAM), metal-oxide resistive random access memory elements (RRAM), magneto-resistive random access memory elements (MRAM), ferroelectric random access memory elements (FeRAM) and optical memory elements.

12. A memory device according to claim 1, wherein the resistive elements are embodied as system elements, the system elements comprising a plurality of transistors, resistors, capacitors, and/or inductors, the plurality of transistors, resistors, capacitors, and/or inductors being configured to jointly emulate a behavior of a resistive element.

13. A memory device according to claim 1, wherein the memory device is an in-memory computing device.

14. A memory device according to claim 13, the memory device being a device for performing a matrix-vector multiplication of a matrix with a vector, the memory device comprising:
a memory crossbar array comprising
a plurality of row lines;
a plurality of column lines;
a plurality of junctions arranged between the plurality of row lines and the plurality of column lines, wherein each junction comprises a programmable resistive element and an access element comprising an access terminal for accessing the programmable resistive element;
a signal generator configured to
apply programming signals to the resistive elements to program the single weights for the matrix-vector multiplication;
a readout circuit configured to
apply read voltages to the row lines of the memory crossbar array; and
read out current values of the column lines of the memory crossbar array.

15. A method for operating a memory device comprising a plurality of resistive elements and a control unit for controlling the memory device, the method comprising:
programming single weights of the memory device by groups of at least two resistive elements;
programming a first subset of the resistive elements of the groups by single shot programming; and
programming a second subset of the resistive elements of the groups by an iterative programming scheme, the iterative programming scheme correcting a residual programming error of the single weights by a feedback mechanism.

16. A method according to claim 15, further comprising
performing, at a first programming step, the single shot programming of the resistive elements of all first subsets of an array;
performing a waiting step to facilitate a stabilization of the drift of the conductance values of the resistive elements of the first subset; and
performing, at a second programming step, the iterative programming of the resistive elements of the second subsets of the array.

17. A computer program product for operating a memory device comprising a plurality of resistive elements and a control unit for controlling the memory device, the computer program product comprising a non-transitory computer readable storage medium having program instructions embodied therewith, the program instructions executable by the control unit of the memory device to cause the control unit to perform a method comprising:
programming single weights of the memory device by groups of at least two resistive elements;
programming a first subset of the resistive elements of the groups by single shot programming; and
programming a second subset of the resistive elements of the groups by an iterative programming scheme, the iterative programming scheme correcting a residual programming error of the single weights by a feedback mechanism.

* * * * *